(12) United States Patent
Shi et al.

(10) Patent No.: US 12,040,780 B2
(45) Date of Patent: Jul. 16, 2024

(54) BAND-STOP FILTER AND MULTI-FREQUENCY BAND-STOP FILTER

(71) Applicant: ANHUI ANUKI TECHNOLOGIES CO., LTD., Anhui (CN)

(72) Inventors: Qilin Shi, Anhui (CN); Chengjie Zuo, Anhui (CN); Jun He, Anhui (CN)

(73) Assignee: ANHUI ANUKI TECHNOLOGIES CO., LTD., Anhui (CN)

( * ) Notice: Subject to any disclaimer, the term of this patent is extended or adjusted under 35 U.S.C. 154(b) by 343 days.

(21) Appl. No.: 17/610,515

(22) PCT Filed: Aug. 20, 2021

(86) PCT No.: PCT/CN2021/113745
§ 371 (c)(1),
(2) Date: Nov. 11, 2021

(87) PCT Pub. No.: WO2022/227347
PCT Pub. Date: Nov. 3, 2022

(65) Prior Publication Data
US 2022/0345109 A1    Oct. 27, 2022

(30) Foreign Application Priority Data

Apr. 26, 2021   (CN) .......................... 202110452411.4
Apr. 26, 2021   (CN) .......................... 202120877444.9

(51) Int. Cl.
*H03H 9/205*      (2006.01)
*H03H 9/64*       (2006.01)

(52) U.S. Cl.
CPC .............. *H03H 9/205* (2013.01); *H03H 9/64* (2013.01)

(58) Field of Classification Search
CPC ........ H03H 9/00; H03H 7/0115; H03H 7/075; H03H 2007/013; H03H 7/12; H03H 9/64; H03H 9/205
USPC ......................... 333/175, 176, 186, 193, 190
See application file for complete search history.

(56) References Cited

U.S. PATENT DOCUMENTS

| 7,084,718 B2 | 8/2006 | Nakamura et al. |
| 8,773,221 B2 | 7/2014 | Nakahashi et al. |
| 2012/0306595 A1 | 12/2012 | Omote et al. |
| 2013/0147678 A1 | 6/2013 | Taniguchi |

FOREIGN PATENT DOCUMENTS

| CN | 113067561 | 7/2021 |
| JP | 2009296167 | 12/2009 |
| WO | 2007015331 | 2/2007 |

OTHER PUBLICATIONS

International Search Report, PCT/CN2021/113745, mailed on Dec. 23, 2021.

*Primary Examiner* — Rakesh B Patel
(74) *Attorney, Agent, or Firm* — Greenberg Traurig

(57) ABSTRACT

Provided are a band-stop filter and a multi-frequency band-stop filter. The band-stop filter includes at least one band-stop filtering unit; the at least one band-stop filtering unit includes an input port, an output port, at least two resonators, and at least one inductive element; and the first terminal of the first resonator is connected between the input port and the inductive element, and the first terminal of the second resonator is connected between the output port and the inductive element.

8 Claims, 4 Drawing Sheets

BAND-STOP FILTER AND MULTI-FREQUENCY BAND-STOP FILTER

The present application is a national phase application under 35 U.S.C. § 371 of International Patent Application PCT/CN2021/113745, filed on Aug. 20, 2021, which claims priority to both Chinese Patent Application No. 202110452411.4 filed with the China National Intellectual Property Administration (CNIPA) on Apr. 26, 2021, and Chinese Patent Application No. 202120877444.9 filed with the CNIPA on Apr. 26, 2021, the disclosures of which applications are hereby incorporated herein by reference in their entireties.

TECHNICAL FIELD

Embodiments of the present application relate to the technical field of communications, and for example, a band-stop filter and a multi-frequency band-stop filter.

BACKGROUND

With the development of communication technology, the requirements for spectrum efficiency are increasing, thus the transmission band spacing between different information is narrowing in the process of information transmission. Therefore, the band-stop filter is required to filter out the noise spectrum or the spectrum without any transmission signal through transmission signals within a specific frequency range, so as to satisfy the demands of information transmission.

Lumped elements, such as capacitors and inductors, or microstrip-line circuits are usually used by designers to form band-stop filters, but the design size of these two kinds of band-stop filters is too large to satisfy the application requirements of small portable devices. In addition, the band-stop filters formed by lumped elements such as capacitors and inductors or the band-stop filters formed by microstrip-line circuits have a low quality factor and a poor spectrum suppression effect within the stopband range.

SUMMARY

Embodiments of the present disclosure provide a band-stop filter and a multi-frequency band-stop filter to solve the defect of large size of the circuit of the band-stop filter so that the filter can satisfy the application requirements of small portable devices and improve the suppression effect on signals within the stopband range.

The present disclosure provides a band-stop filter which includes at least one band-stop filtering unit. The at least one band-stop filtering unit includes an input port, an output port, at least two resonators, and at least one inductive element; where the at least two resonators include at least one first resonator and at least one second resonator.

The first terminal of the at least one first resonator is connected between the input port and the inductive element, and the second terminal of the at least one first resonator is connected to a first fixed potential terminal. The first terminal of the at least one second resonator is connected between the output port and the inductive element, and the second terminal of the at least one second resonator is connected to a second fixed potential terminal.

The present disclosure further provides a multi-frequency band-stop filter which includes at least two band-stop filters described above. The at least two band-stop filters are connected in series, and the difference between resonant frequencies of the at least two band-stop filters is greater than the stopband bandwidth of one of the at least two band-stop filters.

BRIEF DESCRIPTION OF DRAWINGS

To illustrate the embodiments of the present application or the related art, the accompanying drawings used in the embodiments of the present application or the related art will be described briefly below. The drawings in the following description are merely some embodiments of the present application, and for those skilled in the art, other structures and drawings may be expanded and extended according to the device structures disclosed and suggested in various embodiments of the present application.

DETAILED DESCRIPTION

Embodiments of the present application will be described clearly and completely in conjunction with the accompanying drawings in the embodiments of the present application. The described embodiments are part, not all, of embodiments of the present application. On the basis of the embodiments of the present application, all other embodiments obtained by those of ordinary skill in the art are within the scope of the present application on the premise that no creative work is done.

Figure 1:
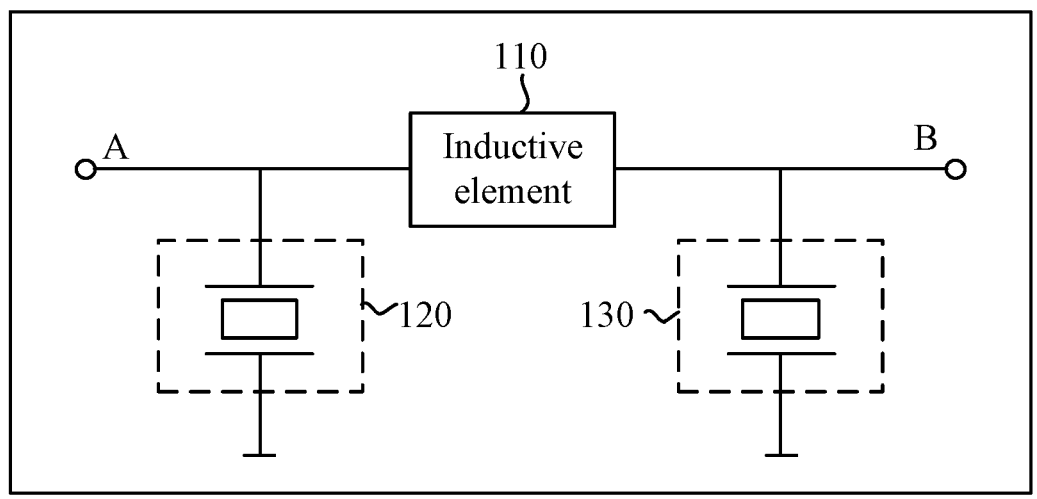
FIG. 1 is a structural diagram of a band-stop filter according to an embodiment of the present application.

An embodiment of the present application provides the structural diagram of a band-stop filter. FIG. 1 is a structural diagram of a band-stop filter according to an embodiment of the present application. As shown in FIG. 1, the band-stop filter includes at least one band-stop filtering unit. The least one band-stop filtering unit includes an input port A, an output port B, at least two resonators and at least one inductive element 110; where the at least two resonators include at least one first resonator 120 and at least one second resonator 130. The first terminal of the first resonator 120 is connected between the input port A and the inductive element 110, and the second terminal of the first resonator 120 is connected to a first fixed potential terminal. The first terminal of the second resonator 130 is connected between the output port B and the inductive element 110, and the second terminal of the second resonator 130 is connected to a second fixed potential terminal.

The input port A is connected to the inductive element 110, and the inductive element 110 is connected to the output port B.

For example, the band-stop filtering unit refers to a band-stop filter through which most frequency components may pass, but frequency components in a specific frequency segment are attenuated to a very low level to prevent these frequency components in the specific frequency segment from passing through. The resonator has a high quality factor and may generate resonant frequencies that have characteristics of strong stability and strong anti-interference. The inductive element 110 has the characteristics of lowpass and highstop and may limit the operating frequency range of the band-stop filter, that is, the insertion loss of transmission signals that pass through the operating frequency range of the inductive element 110 is small. The first resonator 120 may be a first acoustic resonator, and the second resonator 130 may be a second acoustic resonator. Two terminals of the inductive element 110 are connected to the first acoustic resonator and the second acoustic resonator respectively so that the inductive element 110 may generate the stopband within the operating range, thereby achieving the filtering of frequencies within the stopband range.

Figure 2:
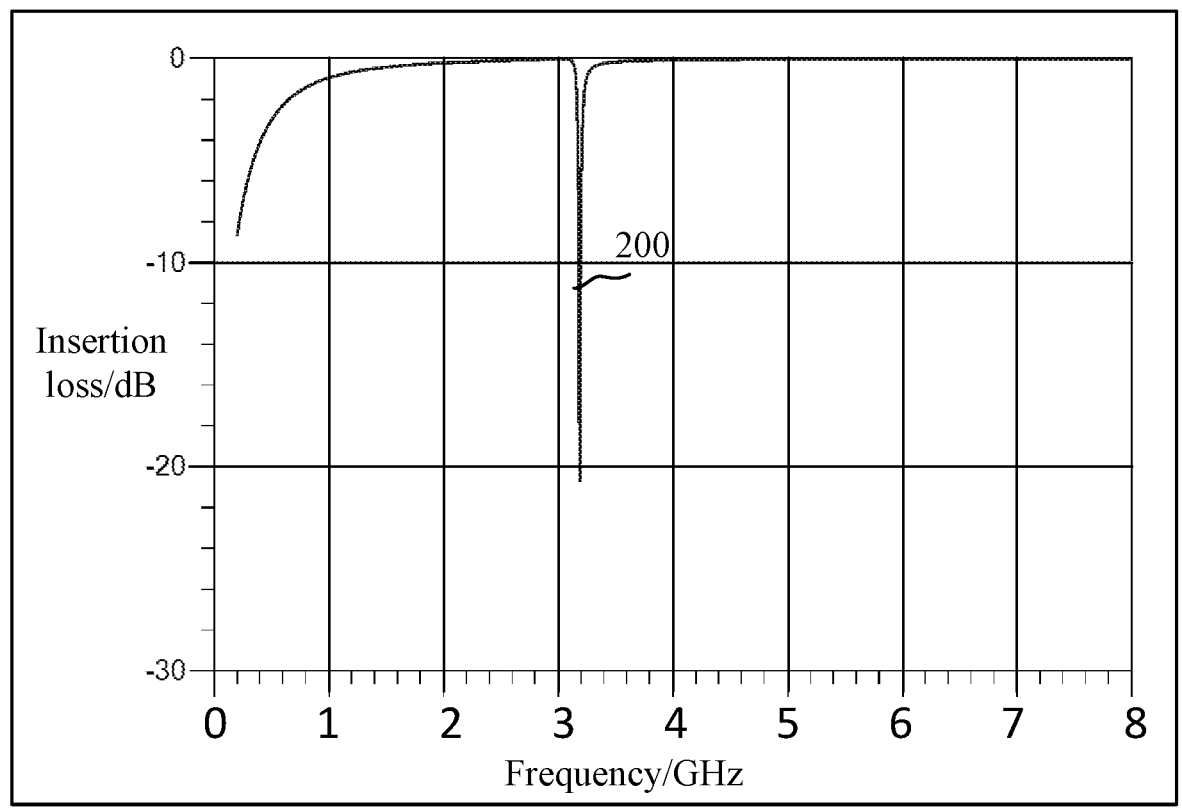
FIG. 2 is a schematic diagram of the performance of a single resonator according to an embodiment of the present application.

FIG. 2 is a schematic diagram of the performance of a single resonator according to an embodiment of the present application, where the abscissa is the frequency of the resonator in GHz, and the ordinate is the insertion loss of signals in dB. Curve 200 is the performance curve of the single resonator. As can be seen from FIG. 2, the single resonator has filtering characteristics on the response of the single resonator itself (that is, the resonator resonates only at the characteristic frequency, and the characteristic of the resonator is equivalent to a band-rejection filter, signals near the resonant frequency are suppressed while signals far away from the resonant frequency may pass through).

Figure 3:
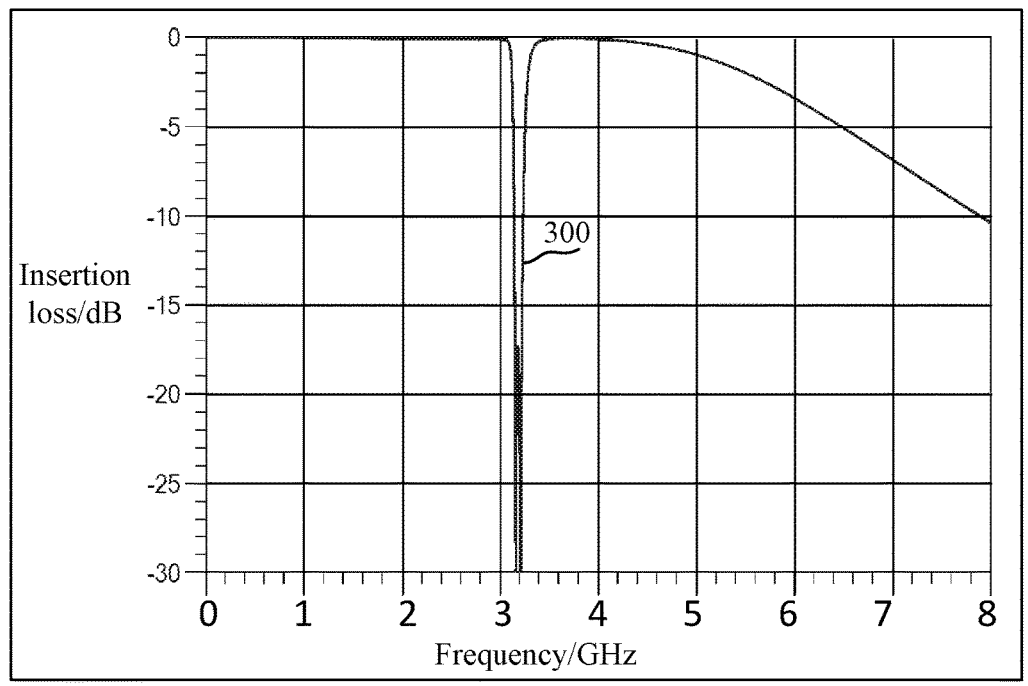
FIG. 3 is a schematic diagram of the performance of a band-stop filter according to an embodiment of the present application.

FIG. 3 is a schematic diagram of the performance of a band-stop filter according to an embodiment of the present application. In terms of the device structure of the band-stop filter in FIG. 3, the band-stop filter corresponding to FIG. 3 includes one band-stop filtering unit which includes one first resonator 120, one second resonator 130, and one inductive element 110. As shown in FIG. 3, the abscissa is the frequency of the band-stop filter, and the ordinate is the insertion loss of signals. Curve 300 is the performance curve of the band-stop filter. As can be seen from FIG. 3, the inductive element 110 may enable the band-stop filter to have the filtering characteristic of very low insertion loss at low frequencies. For example, as shown in FIG. 3, the inductive element 110 may enable the band-stop filter to have the filtering characteristic of very low insertion loss within the range of 0 to 4 GHz. On the basis of this, in the present application, a band-stop filtering unit including at least two resonators may be designed based on the filtering characteristic of the resonator to the response of the resonator itself. The first resonator 120 includes at least one resonator. The first terminal of the first resonator 120 is connected between the input port A and the inductive element 110, and the second terminal of the first resonator 120 is connected to the first fixed potential terminal. The second resonator 130 includes at least one resonator whose resonant frequency characteristic is different from the resonant frequency characteristic of the first resonator 120. The first terminal of the second resonator 130 is connected between the output port B and the inductive element 110, and the second terminal of the second resonator 130 is connected to the second fixed potential terminal. The overlapping range between the resonant frequency of the at least one first resonator 120 and the resonant frequency of the at least one second resonator 130 may be adjusted according to the stopband bandwidth requirements of the band-stop filter, thereby widening the stopband bandwidth of the band-stop filtering unit. The first fixed potential terminal may have the same potential as the second fixed potential terminal, for example, the first fixed potential terminal and the second fixed potential terminal are connected to ground.

With the comparison between FIG. 2 and FIG. 3, the stopband frequency range of the single resonator in FIG. 2 is smaller than the stopband frequency range of the band-stop filter in FIG. 3. The insertion loss of the single resonator in FIG. 2 is smaller than the insertion loss of the band-stop filter in FIG. 3. Therefore, the characteristics of the single resonator including the narrow stopband bandwidth and poor signal suppression characteristic within the stopband range can be alleviated by adopting the first resonator 120 and the second resonator 130 and connecting the first terminals of the first resonator 120 and the second resonator 130 to the two terminals of the inductive element 110 respectively.

With the continued comparison between FIG. 2 and FIG. 3, the insertion loss of the single resonator in FIG. 2 generated for low-frequency signals is larger than the insertion loss of the band-stop filter in FIG. 3 generated for low-frequency signals. In FIG. 3, the operating frequency range limited by the inductive element 110 is 0 to 4 GHz, that is, the inductive element 110 allows frequencies within the range of 0 to 4 GHz to pass through while the inductive element 110 blocks frequency segments greater than 4 GHz from passing through. The first resonator 120 may be a first acoustic resonator, and the second resonator 130 may be a second acoustic resonator. Two terminals of the inductive element 110 are connected to the first acoustic resonator and the second acoustic resonator respectively so that the inductive element 110 generates the stopband within the operating range, and the first acoustic resonator and the second acoustic resonator filter frequencies within the stopband range. It is to be noted here that the resonant frequencies of the first resonator 120 and the second resonator 130 need to be set within the operating frequency range of the inductive element 110. To sum up, since the present application is based on the band-stop filtering unit composed of at least two resonators and at least one inductive element 110, not only an appropriate stopband bandwidth can be designed within the operating range of the inductive element 110 according to the resonant frequency of the resonator, but also the circuit size of the band-stop filter can be decreased, the suppression effect on signals within the stopband range can be improved, and the loss of transmission signals within the operating frequency range of the inductive element 110 and outside the stopband range can be reduced.

For example, with continued reference to FIG. 1, the band-stop filtering unit includes one first resonator 120, one second resonator 130, and one inductive element 110. The first terminal of the first resonator 120 is connected between the input port A and the first terminal of the inductive element 110, and the second terminal of the first resonator 120 is connected to the first fixed potential terminal. The first terminal of the second resonator 130 is connected between the output port B and the second terminal of the inductive element 110, and the second terminal of the second resonator 130 is connected to the second fixed potential terminal.

For example, the band-stop filtering unit includes one first resonator 120, one second resonator 130, and one inductive element 110. The first terminal of the first resonator 120 is connected between the input port A and the first terminal of the inductive element 110, that is, the first terminal of the first resonator 120 is connected to the input port A, which means that the input port A serves as the input port of the band-stop filtering unit. The first terminal of the second resonator 130 is connected between the output port B and the second terminal of the inductive element 110, that is, the first terminal of the second resonator 130 is connected to the output port B, which means that the output port B serves as the output port of the band-stop filtering unit. The second terminal of the first resonator 120 is connected to the first fixed potential terminal, and the second terminal of the second resonator 130 is connected to the second fixed potential terminal. The first fixed potential terminal may have the same potential as the second fixed potential terminal, for example, the first fixed potential terminal and the second fixed potential terminal may both be connected to ground. The band-stop filtering unit includes one inductive element 110 which may limit the operating frequency range of the band-stop filtering unit. The first resonator 120 may be a first acoustic resonator, and the second resonator 130 may be a second acoustic resonator. Two terminals of the inductive element 110 are connected to the first acoustic resonator and the second acoustic resonator respectively so that the inductive element 110 may generate the stopband within the operating range, thereby filtering the frequencies within the stopband range. The first resonator 120 and the second resonator 130 included in the band-stop filtering unit have different resonant frequencies, and the overlapping range between the resonant frequency of the first resonator 120 and the resonant frequency of the second resonator 130 may be adjusted according to the stopband bandwidth requirements of the band-stop filter so that the stopband bandwidth of the band-stop filtering unit can be widened. It is to be noted here that the overlapping range of the resonant frequencies of the first resonator 120 and the second resonator 130 need to be set within the operating frequency range of the inductive element 110. To sum up, the band-stop filter with the 7c-shaped circuit structure is formed by connecting the first terminals of the first resonator 120 and the second resonator 130 to the two terminals of the inductive element 110 respectively, a suitable stopband is designed within the operating range of the inductive element 110 to fully utilize the resonant frequency characteristics of resonators, and a band-stop filter with good filtering characteristics is constructed. The characteristics of the single resonator including the narrow filtering bandwidth and poor signal suppression characteristic within the stopband range can be alleviated, the rapidly attenuated input signals within the stopband frequency range is achieved, the suppression effect on signals within the stopband range is improved, and the loss of transmission signals within the operating frequency range of the inductive element 110 and outside the stopband range is reduced.

In an embodiment, the difference between the resonant frequency of the first resonator 120 and the resonant frequency of the second resonator 130 is greater than zero and less than or equal to the stopband bandwidth of one of the second resonator 130 or the first resonator 120.

The band-stop filtering unit may select the first resonator 120 and the second resonator 130 whose resonant frequencies are approximate but not equal to each other, and the difference between the resonant frequency of the first resonator 120 and the resonant frequency of the second resonator 130 needs to be greater than zero and less than or equal to the stopband bandwidth of one of the second resonator 130 or the first resonator 120. Therefore, the resonant frequency of the first resonator 120 and the resonant frequency of the second resonator 130 may partially overlap, and when the resonant frequency of the first resonator 120 and the resonant frequency of the second resonator 130 partially overlap, the resonant frequencies of the first resonator 120 and the second resonator 130 are merged, thereby widening the stopband bandwidth of the band-stop filtering unit.

In an embodiment, the maximum operating frequency of the inductive element 110 is greater than the stopband frequency of the first resonator 120 and the stopband frequency of the second resonator 130.

For example, since the inductive element 110 has the characteristics of lowpass and highstop, and the conduction frequency segments and suppression frequency segments of inductive elements 110 with different attributes are different, the inductive element with appropriate attributes needs to be selected according to the operating frequency range of the band-stop filter. That is, the inductive element 110 may limit the operating frequency range of the band-stop filter. With continued reference to FIG. 3, as can be seen from FIG. 3, the operating frequency range limited by the inductive element 110 is 0 to 4 GHz, that is, the inductive element 110 allows frequencies within the range of 0 to 4 GHz to pass through while the inductive element 110 blocks frequency segments greater than 4 GHz from passing through. Therefore, the stopband frequency ranges of the first resonator 120 and the second resonator 130 need to be set within the operating range in which the inductive element 110 allows frequencies to pass through, so as to ensure that a certain frequency segment within the frequency-passing range of the inductive element 110 is filtered out, thereby achieving the function of the band-stop filtering unit that most frequencies may pass through and only frequencies in a specific frequency segment are suppressed. The maximum operating frequency of the inductive element 110 is the maximum passable frequency value of the inductive element 110, and the maximum operating frequency of the inductive element 110 only needs to be set to be greater than the stopband frequency of the first resonator 120 and the stopband frequency of the second resonator 130.

Figure 4:
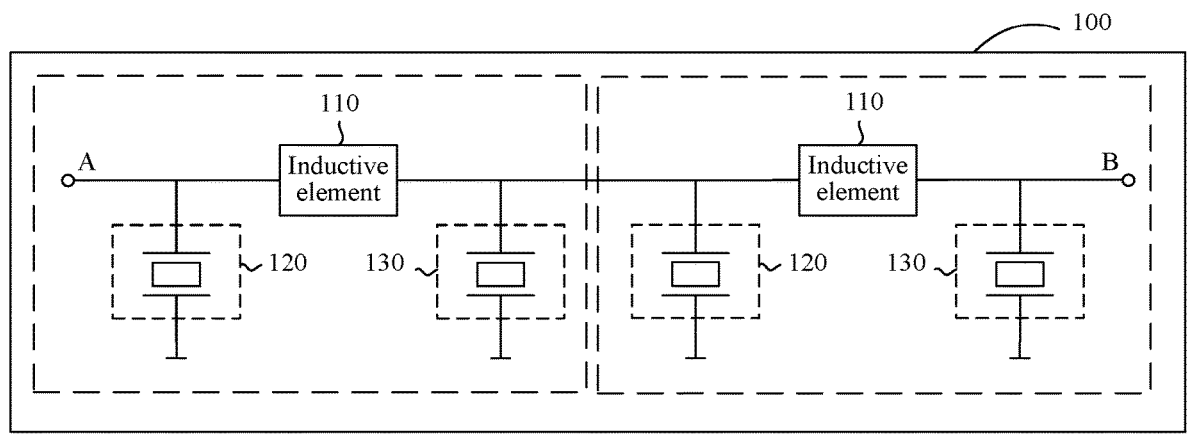
FIG. 4 is a structural diagram of another band-stop filter according to an embodiment of the present application.

FIG. 4 is a structural diagram of another band-stop filter according to an embodiment of the present application. As shown in FIG. 4, the band-stop filter includes at least two band-stop filtering units. The difference between resonant frequencies of two adjacent band-stop filtering units is greater than zero and less than or equal to the stopband bandwidth of any one of the two adjacent band-stop filtering units.

For example, the band-stop filter 100 includes two band-stop filtering units. The band-stop filter 100 includes two first resonators 120, two second resonators 130 and two inductive elements 110. The first terminal of one of the two first resonators 120 is connected between the input port A and the first terminal of one of the two inductive elements 110, and the second terminal of the one first resonator 120 is connected to the first fixed potential terminal. The first terminal of one of the two second resonators 130 and the first terminal of the other first resonator 120 are both connected between the two inductive elements 110, the second terminal of the one second resonator 130 is connected to the second fixed potential terminal, and the second terminal of the other first resonator 120 is connected to the first fixed potential terminal. The first terminal of the other second resonator 130 is connected between the output port B and the other inductive element 110, and the second terminal of the other second resonator 130 is connected to the second fixed potential terminal. Two band-stop filtering units whose resonant frequencies are approximate but not equal to each other may be selected, and the difference between the resonant frequencies of the two band-stop filtering units is greater than zero and less than or equal to the stopband bandwidth of any one of the two band-stop filtering units. Therefore, the overlapping range of the resonant frequencies of the two band-stop filtering units may be adjusted according to the stopband bandwidth requirements of the band-stop filter 100, and the two band-stop filtering units are connected in series so that the resonant frequencies of the two band-stop filtering units are merged, thereby widening the stopband bandwidth of the band-stop filter 100.

Figure 5:
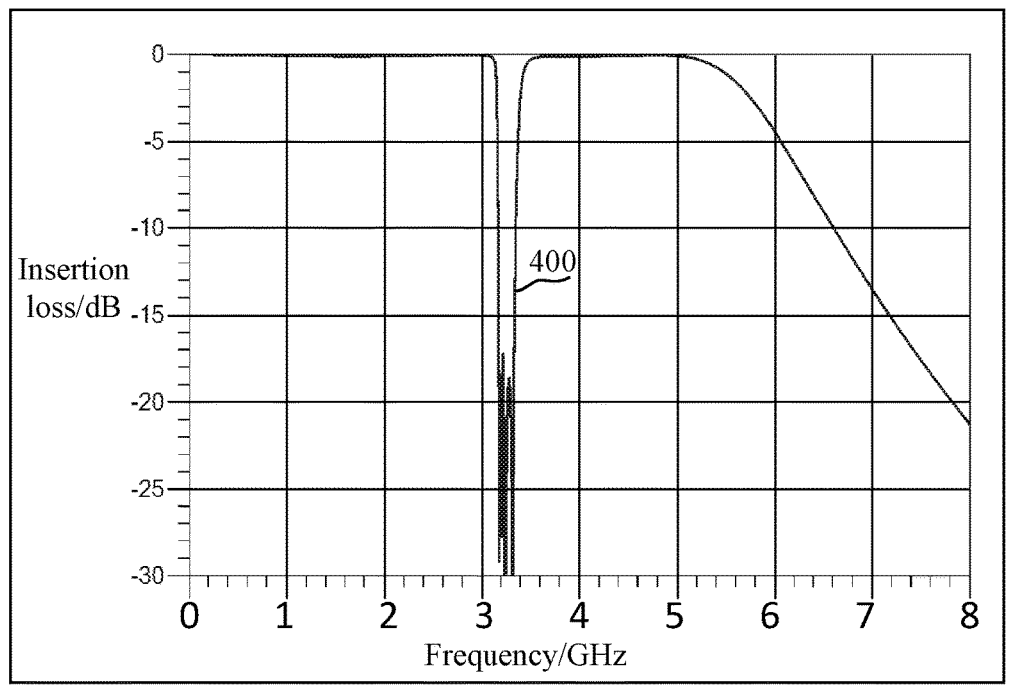
FIG. 5 is a schematic diagram of the performance of another band-stop filter shown in FIG. 4 according to an embodiment of the present application.

For example, FIG. 5 is a schematic diagram of the performance of another band-stop filter as shown in FIG. 4 according to an embodiment of the present application. As shown in FIG. 5, the abscissa is the frequency of the band-stop filter, and the ordinate is the insertion loss of signals. Curve 400 is the performance curve of the band-stop filter shown in FIG. 4. With the comparison between FIG. 3 and FIG. 5, the stopband frequency range of the band-stop filter in FIG. 3 is less than the stopband frequency range of the band-stop filter in FIG. 5. In addition, the band-stop filtering unit includes two inductive elements which may limit the operating frequency range of the band-stop filtering unit. With the continued comparison between FIG. 3 and FIG. 5, the operating frequency range of the band-stop filter in FIG. 3 is less than the operating frequency range of the band-stop filter in FIG. 5. It is to be noted that in FIG. 4, the overlapping range between the resonant frequency of one of the two first resonators 120 and the resonant frequency of one of the two second resonators 130 needs to be set to be within the operating frequency range of the one of the two inductive elements 110; the overlapping range between the resonant frequency of the other first resonator 120 and the resonant frequency of the other second resonator 130 needs to be set to be within the operating frequency range of the other inductive element 110; and the operating range of the band-stop filter 100 is the operating frequency merging both operating frequencies of the inductive elements 110 so that the operating frequency range of the band-stop filter 100 can be widened.

In an embodiment, the stopband bandwidth range of the band-stop filter is set according to to-be-suppressed bandwidths of input signals. In other embodiments, the band-stop filter may adjust the notch bandwidth by adjusting the number of band-stop filtering units.

In an embodiment, the inductive element includes an inductor. The first terminal of the inductor serves as the first terminal of the inductive element, and the second terminal of the inductor serves as the second terminal of the inductive element.

A notch filter composed of patch inductors manufactured based on low temperature co-fired ceramic (LTCC) and surface-mount technologies is adopted in the inductor, which can reduce the size of the band-stop filter and satisfy the requirements of handheld mobile applications. The first terminal of the inductor serves as the first terminal of the inductive element, that is, the first terminal of the inductor is connected to the first terminal of the first resonator and the input port. The second terminal of the inductor serves as the second terminal of the inductive element, that is, the second terminal of the inductor is connected to the first terminal of the second resonator and the output port. The operating frequency range of the band-stop filter can be limited according to the lowpass-highstop characteristics of the inductor.

In an embodiment, the first resonator and the second resonator each include at least one of a surface acoustic wave resonator, a bulk acoustic wave resonator, or a film bulk acoustic wave resonator.

The surface acoustic wave (SAW) resonator mainly converts input signals of electrical waves into mechanical energy through an input and output transducer based on the piezoelectric properties of piezoelectric material, and after processing, the mechanical energy is converted into electrical signals so as to filter out unnecessary signals and noises and improve the transmission quality. The surface acoustic wave resonator is simpler to install and smaller than the conventional LC filter. The acoustic wave in a bulk acoustic wave resonator propagates vertically, and through storing acoustic wave energy in the piezoelectric material, very high quality can be achieved, thus a highly competitive device with the large out-of-band attenuation can be converted. The film bulk acoustic resonator (FBAR) has the characteristics of high Q value and ease of miniaturization. The surface acoustic wave resonator, the bulk acoustic wave resonator, and the film bulk acoustic wave resonator all have the characteristics of small size, low cost, and high Q factor and can satisfy the requirements of highly specific and high performance filtering. The surface acoustic wave resonator is suitable for relatively low frequencies, such as up to 2.7 GHz, while the bulk acoustic resonator and the film bulk acoustic wave resonator are suitable for higher frequencies, such as 2.7 GHz to 6 GHz.

In an embodiment of the present application, the band-stop filter includes at least one band-stop filtering unit. The band-stop filtering unit includes at least one first resonator, at least one inductive element, and at least one second resonator that have different resonant frequency characteristics. According to the lowpass-highstop characteristics of the inductive element, the inductive element may limit the operating frequency range of the band-stop filter, that is, the insertion loss of transmission signals that pass through the operating frequency range of the inductive element is small. Two terminals of the inductive element are connected to the first acoustic resonator and the second acoustic resonator respectively so that the inductive element may generate the stopband within the operating range, thereby filtering the frequencies within the stopband range. In addition, the at least one first resonator and the at least one second resonator may adjust the overlapping range between the resonant frequency of the at least one first resonator and the resonant frequency of the at least one second resonator according to the requirements of the stopband bandwidth of the band-stop filtering unit, thereby widening the stopband bandwidth of the band-stop filtering unit. To sum up, the present application adopts the first resonator and the second resonator, and the first terminals of the first resonator and second resonator are connected to two terminals of the inductive element, respectively, so that an appropriate stopband bandwidth can be designed within the operating range of the inductive element according to the resonant frequencies of the resonators, the circuit size of the band-stop filter can be decreased, the suppression effect on signals within the stopband range can be improved, and the loss of transmission signals within the operating frequency range of the inductive element and outside the stopband range can be reduced.

Figure 6:
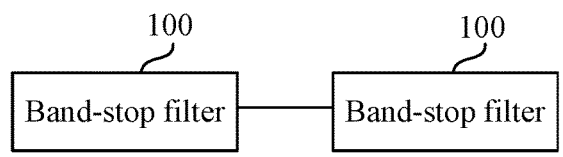
FIG. 6 is a structural diagram of a multi-frequency band-stop filter according to an embodiment of the present application.

FIG. 6 is a structural diagram of a multi-frequency band-stop filter according to an embodiment of the present application. With reference to FIG. 6, the multi-frequency band-stop filter includes the band-stop filter 100 of any one of the above-mentioned embodiments. The multi-frequency band-stop filter includes at least two band-stop filters 100 that are connected in series. The difference between resonant frequencies of the at least two band-stop filters 100 is greater than the stopband bandwidth of any one of the at least two band-stop filters 100.

At least two band-stop filters 100 which are greatly different in the resonant frequency may be selected, and the difference between resonant frequencies of the at least two band-stop filters 100 is greater than the stopband bandwidth of one of the at least two band-stop filters 100. Therefore, each stopband frequency segment does not overlap with one another. With at least two band-stop filters 100 connected in series, signals of at least two different frequency segments can be filtered out according to the filtering requirements of the multi-frequency band-stop filter. Each band-stop filter 100 filters out signals of one corresponding frequency segment.

The multi-frequency band-stop filter includes the band-stop filter provided by any one of the embodiments of the present application, the multi-frequency band-stop filter has the beneficial effects of the band-stop filter provided by the embodiments of the present application, and details are not described here again.

In an embodiment, different band-stop filters of the at least two band-stop filters may have the same number of band-stop filtering units or different numbers of band-stop filtering units.

Figure 7:
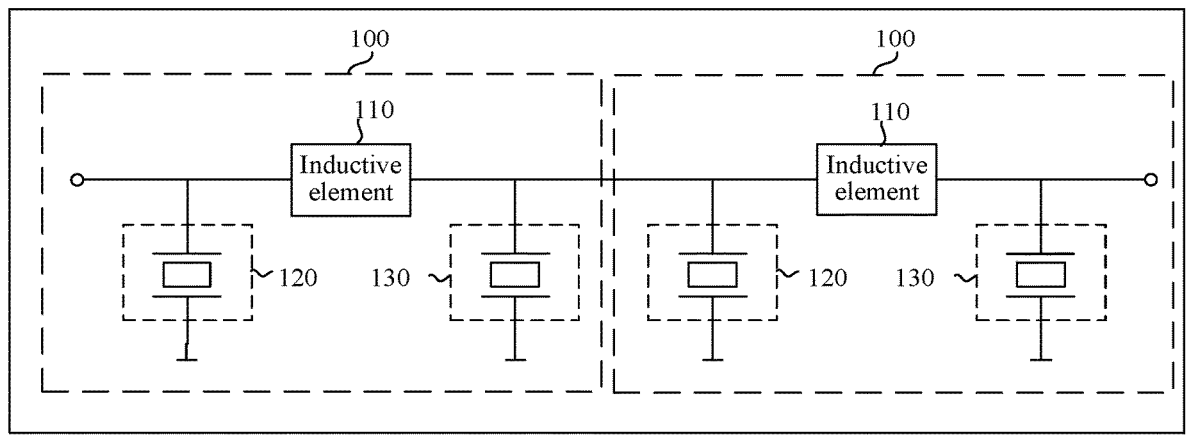
FIG. 7 is a structural diagram of another multi-frequency band-stop filter according to an embodiment of the present application.
Figure 8:
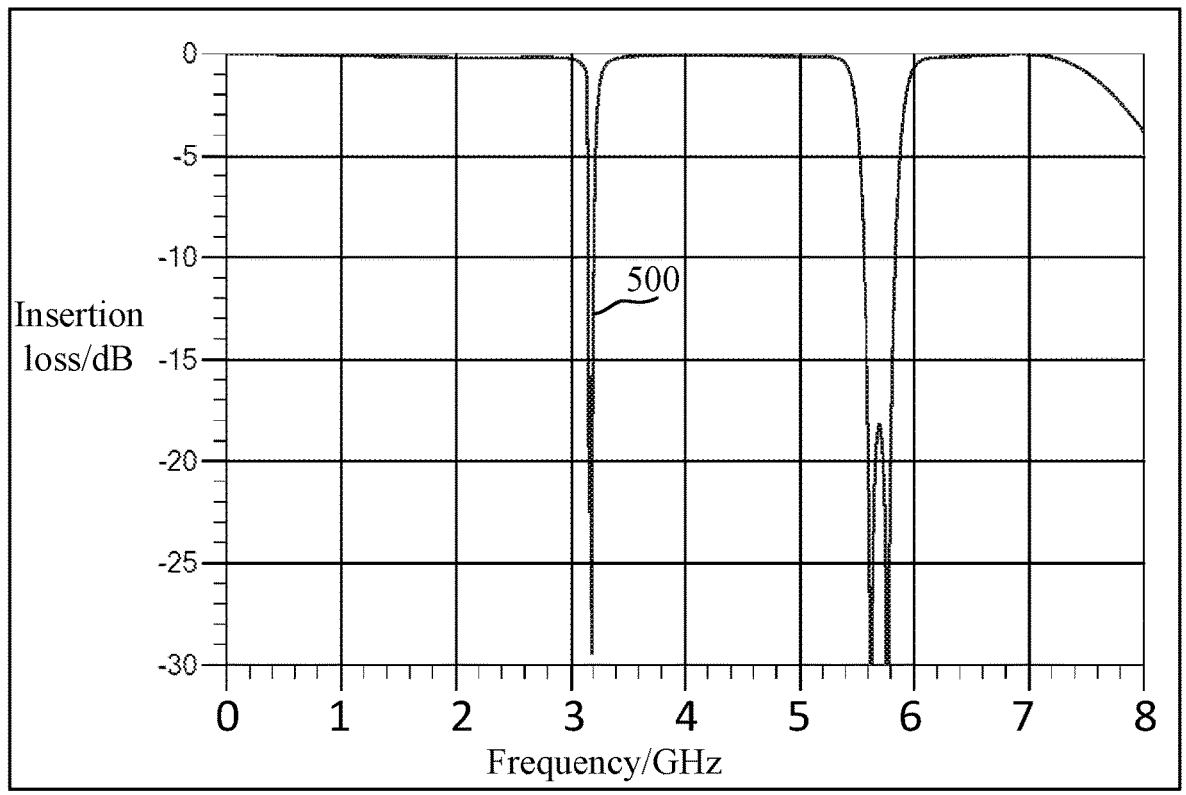
FIG. 8 is a schematic diagram of the performance of another multi-frequency band-stop filter shown in FIG. 7 according to an embodiment of the present application.

For example, FIG. 7 is a structural diagram of another multi-frequency band-stop filter according to an embodiment of the present application. The multi-frequency band-stop filter is composed of two band-stop filters 100 connected in series, each band-stop filter 100 includes a single band-stop filtering unit. The multi-frequency band-stop filter includes four resonators with different resonant frequencies and two inductive elements 110 with different maximum operating frequencies. FIG. 8 is a schematic diagram of the performance of another multi-frequency band-stop filter shown in FIG. 7 according to an embodiment of the present application, in which the abscissa is the frequency of the multi-frequency band-stop filter, and the ordinate is the insertion loss of signals. Curve 500 is the performance curve of the multi-frequency band-stop filter shown in FIG. 7. As can be seen from FIG. 8, the multi-frequency band-stop filter has two stopband frequencies.

The embodiments described above are used to describe the present application and not intended to limit the present application. Although the present application has been described with reference to the above-mentioned embodiments, it should be understood by those of ordinary skill in the art that a plurality of the above-mentioned embodiments may still be modified, or part of the technical features therein may be equivalently substituted. Such modifications or substitutions do not make the corresponding content depart from the scope of the embodiments of the present application.

What is claimed is:

1. A multi-frequency band-stop filter, comprising at least two band-stop filters; wherein the at least two band-stop filters are connected in series, and a difference between resonant frequencies of the at least two band-stop filters is greater than a stopband bandwidth of one of the at least two band-stop filters;
wherein each of the at least two band-stop filters comprises at least one band-stop filtering unit; the at least one band-stop filtering unit comprises an input port, an output port, at least two resonators, and at least one inductive element; and the at least two resonators comprise at least one first resonator and at least one second resonator;
wherein a first terminal of the at least one first resonator is connected between the input port and the at least one inductive element, a second terminal of the at least one first resonator is connected to a first fixed potential terminal, a first terminal of the at least one second resonator is connected between the output port and the at least one inductive element, and a second terminal of the at least one second resonator is connected to a second fixed potential terminal.

2. The multi-frequency band-stop filter according to claim 1, wherein different band-stop filters of the at least two band-stop filters have a same number of band-stop filtering units or different numbers of band-stop filtering units.

3. The multi-frequency band-stop filter according to claim 1, wherein a difference between a resonant frequency of the first resonator and a resonant frequency of the second resonator is greater than zero and less than or equal to a stopband bandwidth of one of the second resonator or the first resonator.

4. The multi-frequency band-stop filter according to claim 1, wherein the at least one inductive element comprises an inductor;
wherein a first terminal of the inductor serves as a first terminal of the at least one inductive element, and a second terminal of the inductor serves as a second terminal of the at least one inductive element.

5. The multi-frequency band-stop filter according to claim 1, wherein one of the at least one band-stop filtering unit comprises one first resonator, one second resonator and one inductive element;
wherein the first terminal of the first resonator is connected between the input port and a first terminal of the inductive element, the second terminal of the first resonator is connected to the first fixed potential terminal, the first terminal of the second resonator is connected between the output port and a second terminal of the inductive element, and the second terminal of the second resonator is connected to the second fixed potential terminal.

6. The multi-frequency band-stop filter according to claim 5, wherein each of the at least two band-stop filters comprises at least two band-stop filtering units; wherein a difference between resonant frequencies of two adjacent band-stop filtering units of the at least two band-stop filtering units is greater than zero and less than or equal to a stopband bandwidth of any one of the two adjacent band-stop filtering units.

7. The multi-frequency band-stop filter according to claim 5, wherein a maximum operating frequency of the inductive element is greater than a stopband frequency of the first resonator and a stopband frequency of the second resonator.

8. The multi-frequency band-stop filter according to claim 7, wherein the first resonator and the second resonator each comprise at least one of a surface acoustic wave resonator, a bulk acoustic wave resonator, or a film bulk acoustic wave resonator.

* * * * *